United States Patent
Ott et al.

(10) Patent No.: US 7,220,936 B2
(45) Date of Patent: May 22, 2007

(54) PULSE THERMAL PROCESSING OF FUNCTIONAL MATERIALS USING DIRECTED PLASMA ARC

(75) Inventors: Ronald D. Ott, Knoxville, TN (US);
Craig A. Blue, Knoxville, TN (US);
Nancy J. Dudney, Knoxville, TN (US);
David C. Harper, Kingston, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 40 days.

(21) Appl. No.: 10/903,071

(22) Filed: Jul. 30, 2004

(65) Prior Publication Data

US 2006/0021975 A1    Feb. 2, 2006

(51) Int. Cl.
*B23K 10/00*    (2006.01)

(52) U.S. Cl. .......................... 219/121.54; 219/121.59; 392/407; 264/483

(58) Field of Classification Search ........... 219/121.54, 219/121.48, 121.36, 121.43, 121.41, 502, 219/121.59; 264/483; 392/416, 418, 407
See application file for complete search history.

(56) References Cited

U.S. PATENT DOCUMENTS

| | | | |
|---|---|---|---|
| 4,349,581 A | 9/1982 | Asano et al. | |
| 4,937,490 A | 6/1990 | Camm et al. | |
| 5,227,331 A | 7/1993 | Westmoreland | |
| 5,242,264 A | 9/1993 | Kojima et al. | |
| 6,174,388 B1 | 1/2001 | Sikka et al. | |
| 6,380,044 B1* | 4/2002 | Talwar et al. | 438/308 |
| 6,465,284 B1* | 10/2002 | Adachi et al. | 438/151 |
| 6,663,826 B1* | 12/2003 | Blue et al. | 419/3 |
| 6,770,515 B1* | 8/2004 | Makita et al. | 438/149 |
| 2005/0213949 A1* | 9/2005 | Koren et al. | 382/416 |

FOREIGN PATENT DOCUMENTS

| | | |
|---|---|---|
| EP | 0 272 527 A | 6/1988 |
| FR | 2 243 768 | 4/1982 |
| WO | WO 02/04151 A2 | 1/2002 |

OTHER PUBLICATIONS

H. Zeng, et al., "Chemical Ordering of FePt Nanoparticle Self-Assemblies by Rapid Thermal Annealing," J of Magnetism and Magnetic Materials, 2002, pp. 1-6 and Attach, Elsevier.
Mattson Technology Inc., "Rapid Thermal Processing," http://www.red-electronics.com/semiconductor/index.asp..., 2004, pp. 1-3.

* cited by examiner

*Primary Examiner*—Mark Paschall
(74) *Attorney, Agent, or Firm*—Joseph A. Marasco; Neil R. Jetter

(57) ABSTRACT

A method of thermally processing a material includes exposing the material to at least one pulse of infrared light emitted from a directed plasma arc to thermally process the material, the pulse having a duration of no more than 10 s.

36 Claims, 1 Drawing Sheet

PULSE THERMAL PROCESSING OF FUNCTIONAL MATERIALS USING DIRECTED PLASMA ARC

The United States Government has rights in this invention pursuant to contract no. DE-AC05-00OR22725 between the United States Department of Energy and UT-Battelle, LLC.

FIELD OF THE INVENTION

The present invention relates to methods of rapidly processing functional materials, and more particularly to rapidly processing functional layers on temperature-sensitive substrates by exposure to pulsed infrared radiation emitted from a directed plasma arc (DPA).

BACKGROUND OF THE INVENTION

Known methods of thermally processing (annealing and sintering, for example) functional materials must generally be performed at elevated temperatures and take several hours, thus a substrate that supports a functional material must be capable of withstanding the requisite processing environment. In order to advance the technology of thin-film and nanoparticle devices, more attractive substrates that are light-weight and flexible must be considered. In many cases, substrates that would fulfill such criterion are temperature-sensitive and are not able to withstand the processing environment of a conventional furnace. Such temperature-sensitive substrates—for example, low melting point, light-weight metals and flexible polymers, cannot withstand the high temperatures necessary for processing the thin-film. Moreover, there is a need for larger area processing and shorter processing times than that available with conventional processes.

It is helpful to review some of the prior work relating to thermal processing of functional materials. The entire disclosure of each of the following U.S. patents and patent applications is incorporated herein by reference:

U.S. Pat. No. 4,937,490 issued on Jun. 26, 1990 to Camm, et al.

U.S. Pat. No. 6,174,388[M1] issued on Jan. 16, 2001 to Sikka, et al.

U.S. Pat. No. 6,663,826[M2] issued on Dec. 16, 2003 to Blue, et al.

U.S. Patent Application Publication No. 20010036219 published on Nov. 1, 2001 to Camm, et al.

U.S. Patent Application Publication No. 20020067918 published on Jun. 6, 2002 to Camm, et al.

U.S. Patent Application Publication No. 20020102098 published on Aug. 1, 2002 to Camm, et al.

U.S. Patent Application Publication No. 20030206732 published on Nov. 6, 2003 to Camm, et al.

OBJECTS OF THE INVENTION

Accordingly, objects of the present invention include: provision of processes for rapid thermal processing of functional materials, especially on temperature-sensitive substrates, including large area processing, shorter processing times, minimization of grain growth of thin films, and minimization of sintering of nanoparticles.

Further and other objects of the present invention will become apparent from the description contained herein.

SUMMARY OF THE INVENTION

In accordance with one aspect of the present invention, the foregoing and other objects are achieved by a method of thermally processing a material that includes exposing the material to at least one pulse of infrared light emitted from a directed plasma arc to thermally process the material, the pulse having a duration of no more than 10 s.

In accordance with another aspect of the present invention, a method of thermally processing a functional material on a temperature-sensitive substrate includes exposing the functional material to at least two pulses of infrared light emitted from a directed plasma arc to thermally process said functional material, the two pulses each having a duration of no more than 10 s and a periodicity of no more than 60 s so that the temperature-sensitive substrate is not deleteriously affected by the infrared light.

Figure 1:
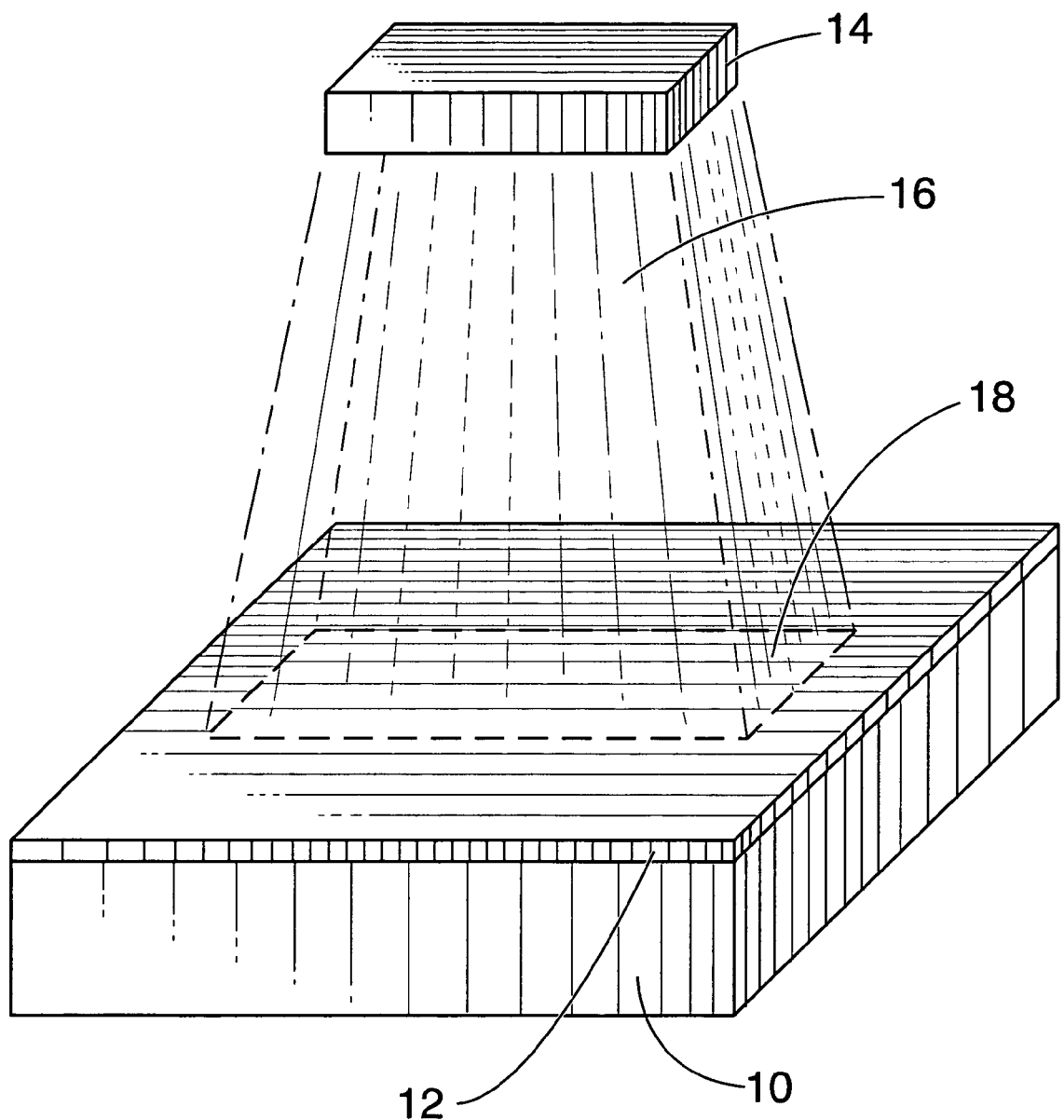
FIG. 1 is a schematic illustration of a process being carried out in accordance with the present invention.

For a better understanding of the present invention, together with other and further objects, advantages and capabilities thereof, reference is made to the following disclosure and appended claims in connection with the above-described drawings.

DETAILED DESCRIPTION OF THE INVENTION

Pulsed energy from a directed, high density infrared plasma arc lamp, referred to hereinafter by the term "directed plasma arc" (DPA) is the basic tool used in the present invention. A suitable device that produces the necessary DPA is described in U.S. Pat. No. 4,937,490 (referenced above). The DPA can supply large power densities, up to 20,000 W/cm$^2$, for example, depending on the setup, simultaneously over large areas, for example, 300 cm$^2$, in short time frames in a completely controlled manner. The device is highly adaptable to meet the needs of many different applications.

The heating process utilizing the pulsed DPA is capable of quickly delivering large amounts of heat over large surface areas with little or no deleterious influence upon subsurface compositions. Pulses of IR energy from the DPA can be of as short in duration and/or periodicity as the physical limitations of the device that produces the DPA, preferably in a manner that allows precise control various process parameters, such as work-piece surface temperature, temperature programming, and the like. The process can be carried out in a vacuum, air, liquid, inert fluid, reactive fluid, or any type of environment needed for processing.

In accordance with the present invention, the duration of a pulse of IR from the DPA can be any duration within the range of 0.5 μs (microsecond) to 10 s (second), inclusive, with typical pulse durations being, for example, 0.5, μs, 0.75 μs, 1 μs, 2.5 μs, 5 μs, 10 μs, 25 μs, 50 μs, 75 μs, 100 μs, 250 μs, 500, μs, 750 μs, 1 ms, 2.5 ms, 5 ms, 10 ms, 25 ms, 50 ms, 75 ms, 100 ms, 250 ms, 500, ms, 750 ms, 1 s, 2.5 s, 5 s, and 10 s. Pulse duration can be held to a single duration throughout the process, or it can be varied as desired within the defined range.

In accordance with the present invention, the periodicity (time interval between the end of one pulse and the beginning of the next pulse) can be any periodicity within the range of 0.500 ns to 60 s, inclusive, with typical periodicities being, for example, 0.5 µs, 0.75 µs, 1 µs, 2.5 µs, 5 µs, 10 µs, 25 µs, 50 µs, 75 µs, 100 µs, 250 µs, 500, µs, 750 µs, 1 ms, 2.5 ms, 5 ms, 10 ms, 25 ms, 50 ms, 75 ms, 100 ms, 250 ms, 500, ms 750 ms, 1 s, 2.5 s, 5 s, 10 s, 20 s, 30 s, 45 s, and 60 s. Pulse periodicity can be held to a single periodicity throughout the process, or it can be varied as desired within the defined range.

Referring to FIG. 1, a typical work-piece 10 has a coating 12. A DPA 14 directs a pulsed beam of IR light 16 onto an area 18 of the coating 12 to thermally process the coating 12.

The high-temperature and short exposure times associated with DPA pulse thermal processing make it possible to process, for example, crystallization of amorphous films, recrystallization and grain growth, and grain boundary refinement of crystalline films, phase transformation sans sintering, controlled sintering and other thin-film and nanoparticle processing, without excessive heating of the substrate. Functional materials can thus be processed on temperature-sensitive substrates so that the temperature-sensitive substrate is not deleteriously affected by the infrared light.

The term "temperature-sensitive" as used herein means that, at a temperature equal to or less than the temperature at which a functional material coated thereon is processed, at least a portion of the substrate melts, decomposes, reacts, sublimes, interdiffuses with the functional material, or otherwise changes physically or chemically in a way that is deleterious to its usefulness as a substrate. A substrate can be monolithic or it can be layered, any layer of which can be temperature-sensitive.

Some examples of functional materials include, but are not limited to nanoparticle materials, thin-film materials, thick-film materials, and the like. Some examples of temperature-sensitive substrates include, but are not limited to biomaterials, polymers, resins, other organic materials, metals, ceramics, semiconductors, and other inorganic materials.

A typical process may proceed as is as follows:

1. A functional material is deposited or grown on a substrate.

2. The functional material is exposed the DPA at a low power level in order to preheat the thin-film/substrate system, if needed. This low power level can be maintained for sufficient time to allow thermal equilibrium to occur.

3. The DPA is pulsed at a preselected higher level power, and for a preselected pulse duration.

4. The DPA is brought back down to the preheat power level and held for a preselected period of time.

5. Steps 3 and 4 are repeated, applying large amounts of energy to the functional material in short bursts over large areas.

The temperature of the functional material can be raised at a controlled rate of up to several orders of magnitude higher than currently available with tungsten-halogen based infrared radiant heating sources. Time at maximum temperature can be minimized.

The present invention is suitable for at least the following specific applications:

Nanoparticle Systems

Some nanoparticle systems require critical heat treating steps, which often present the challenge of processing these systems, and processing them on a temperature-sensitive substrate. It is often necessary to control the sintering process of the nanoparticles. In some instances it may be necessary to prevent sintering altogether while performing some other process (for example, phase change) within the nanoparticles. Other instances require varying degrees of sintering so that there is control over the density of the nanoparticle system.

The present invention is applicable to self-assembled nanoparticle magnetic media systems such as FePt, FePtAu, and CoPt, for example. As-deposited nanoparticles must undergo phase transformation with minimal sintering in order to obtain the desired magnetic properties. Currently, data densities of 30–50 GBit/in$^2$ are attainable. With the aid of the present invention, data densities of 1 TBit/in$^2$ are attainable by decreasing grain size, and also the number of grains per bit. With the aid of the present invention, grain size distribution can be reduced for the current state-of-the-art of 25% to no more than 10%, and even less than 5% under optimized conditions.

In an optimized self-assembled FePt nanoparticle magnetic media system made the average nanoparticle size is about 3.5 nm, with grain size distribution of no more than 5%. Self-assembly occurs during solvent evaporation, controlled by steric repulsive forces (usually due to an organic surfactant coating that is often used) and natural attractive forces and interactions of the nanoparticles. Self-assembly preferably results in a closed-packed structure with a center-to-center distance of about 8 nm.

Processing of the self-assembled FePt nanoparticle structure in accordance with the present invention can promote thermal annealing while inhibiting sintering. Moreover, breakdown of the organic surfactant is minimized, preventing agglomeration of the nanoparticles. The result is phase transformation of the nanoparticles from a disordered face-centered-cubic (FCC) structure to an ordered $L1_0$ face-centered-tetragonal (FCT) structure. This structure is characterized by optimal magnetic properties for high density data storage.

The present invention is applicable to nanoparticle photovoltaic systems such as a Cu—In—Ga—Se (CIGS) and Cu—In—Se (CIS) systems, for example. The CIGS system has shown the highest efficiencies for next generation solar cells. One problem with sputtered thin-film production of the CIGS system is that there is little control of the composition over large areas. By utilizing a screen printing process to deposit a CIGS, or some other similar system, nanoparticle composition there is more compositional control over large areas. In order for the nanoparticle system to achieve high collection efficiencies the nanoparticles need to undergo a sintering process that might require temperatures in the range of 500° C. to 700° C. Obviously, polymer or other temperature-sensitive substrates cannot withstand such an environment, unless they were processed utilizing the present invention procedure. Utilizing the present invention, the density of the nanoparticle system can be controlled to full density on temperature-sensitive substrates.

The present invention is applicable to nanotube systems such as carbon and FeMo nanotube systems, for example. Processing in accordance with the present invention can induce rapid nucleation of single-walled nanotubes. By starting with nanoparticles and rapidly nucleating nanotubes from those nanoparticles, single-walled nanotubes will generally be the predominant product. However, if the nanoparticles are allowed to sinter prior to nucleation of the nanotubes, then the starting volume for the nanotube has increased and the product will predominantly be multi-walled nanotubes. Thus, by rapidly nucleating the nanotubes from the nanoparticles without sintering occurring, predominantly single-walled nanotubes can be produced in accordance with the present invention.

Thin-Film Systems

The present invention is useful for processing various thin-film materials on any type of substrate. These annealing processes can be, but not limited to, recrystallization of crystalline films, crystallization of amorphous films, grain growth, and grain boundary refinement. Examples of applications in which these annealing processes provide benefits are thin-film photovoltaic materials where large grains and refined grain boundaries are needed to improve device efficiency.

Other applications of the present invention include thin-film batteries, thin-film transistors (TFT), and other microelectronic applications, many of which generally require crystallization of an amorphous thin-film and/or improved grain growth. Examples of thin-film materials include lithium-containing thin-film battery components, amorphous silicon, germanium, germanium-silicon alloys, and indium-doped titanium oxide.

While there has been shown and described what are at present considered the preferred embodiments of the invention, it will be obvious to those skilled in the art that various changes and modifications can be prepared therein without departing from the scope of the inventions defined by the appended claims.

What is claimed is:

1. A method of thermally processing an area of a material, comprising the steps of:
    simultaneously exposing all of said area of said material to at least one pulse of light emitted from a directed plasma arc lamp having a power output of no more than about 20,000 W/cm$^2$, said lamp emitting broadband primarily infrared radiation spanning from 0.2 µm to 1.4 µm to thermally process said material, said at least one pulse having a duration of no more than 10 s.

2. A method of thermally processing a material in accordance with claim 1 wherein said pulse has a duration in the range of 1 µs to 500 ms.

3. A method of thermally processing a material in accordance with claim 1 wherein said exposing step further comprises at least two pulses of light emitted from a directed plasma arc, said pulses having a periodicity of no more than 60 s.

4. A method of thermally processing a material in accordance with claim 1 wherein said pulses have a periodicity in the range of 1 µs to 30 s.

5. A method of thermally processing a material in accordance with claim 1 wherein said material comprises a functional material.

6. A method of thermally processing a material in accordance with claim 5 wherein said functional material further comprises at least one functional material selected from the group consisting of a nanoparticle material, a thin-film material, and a thick-film material.

7. A method of thermally processing a material in accordance with claim 5 wherein said functional material further comprises a self-assembled nanoparticle magnetic media system.

8. A method of thermally processing a material in accordance with claim 7 wherein said self-assembled nanoparticle magnetic media system further comprises at least one material selected from the group consisting of FePt, FePtAu, and CoPt.

9. A method of thermally processing a material in accordance with claim 5 wherein said functional material further comprises a photovoltaic material.

10. A method of thermally processing a material in accordance with claim 9 wherein said photovoltaic system further comprises at least one material selected from the group consisting of Cu—In—Ga—Se and Cu—In—Se.

11. A method of thermally processing a material in accordance with claim 5 wherein said functional material further comprises a nanotube system.

12. A method of thermally processing a material in accordance with claim 11 wherein said nanotube system further comprises at least one material selected from the group consisting of carbon and FeMo.

13. A method of thermally processing a material in accordance with claim 11 wherein said nanotube system further comprises predominantly single-walled nanotubes.

14. A method of thermally processing a material in accordance with claim 11 wherein said nanotube system further comprises predominantly double-walled nanotubes.

15. A method of thermally processing a material in accordance with claim 5 wherein said functional material further comprises at least one material selected from the group consisting of a transistor material, and a battery material.

16. A method of thermally processing a material in accordance with claim 15 wherein said transistor material further comprises at least one material selected from the group consisting of silicon, germanium, a germanium-silicon alloy, and indium-doped titanium oxide.

17. A method of thermally processing a material in accordance with claim 15 wherein said battery material further comprises Li.

18. A method of thermally processing a material in accordance with claim 1 further comprising a substrate upon which said material is supported.

19. A method of thermally processing a material in accordance with claim 18 wherein said substrate further comprises a temperature-sensitive material.

20. A method of thermally processing a material in accordance with claim 19 wherein said temperature-sensitive material further comprises at least one material selected from the group consisting of a biomaterial, a polymer, a resin, a metal, a ceramic, and a semiconductor.

21. A method of thermally processing an area of a functional material on a temperature-sensitive substrate comprising the steps of:
    simultaneously exposing all of said area of said functional material to at least two pulses of light emitted from a directed plasma arc lamp having a power output of no more than about 20,000 W/cm$^2$, said lamp emitting broadband primarily infrared radiation spanning from 0.2 µm to 1.4 µm to thermally process said functional material, said at least two pulses each having a duration of no more than 10 s and a periodicity of no more than 60 s so that said temperature-sensitive substrate is not deleteriously affected by said light.

22. A method of thermally processing a functional material on a temperature-sensitive substrate in accordance with claim 21 wherein said pulse has a duration in the range of 1 µs to 500 ms.

23. A method of thermally processing a functional material on a temperature-sensitive substrate in accordance with claim 21 wherein said pulses have a periodicity in the range of 1 µs to 30 s.

24. A method of thermally processing a functional material on a temperature-sensitive substrate in accordance with claim 21 wherein said functional material further comprises at least one functional material selected from the group consisting of a nanoparticle material, a thin-film material, and a thick-film material.

25. A method of thermally processing a functional material on a temperature-sensitive substrate in accordance with claim 21 wherein said functional material further comprises a self-assembled nanoparticle magnetic media system.

26. A method of thermally processing a functional material on a temperature-sensitive substrate in accordance with claim 25 wherein said self-assembled nanoparticle magnetic media system further comprises at least one material selected from the group consisting of FePt, FePtAu, and CoPt.

27. A method of thermally processing a functional material on a temperature-sensitive substrate in accordance with claim 21 wherein said functional material further comprises a photovoltaic material.

28. A method of thermally processing a functional material on a temperature-sensitive substrate in accordance with claim 27 wherein said photovoltaic system further comprises at least one material selected from the group consisting of Cu—In—Ga—Se and Cu—In—Se.

29. A method of thermally processing a functional material on a temperature-sensitive substrate in accordance with claim 21 wherein said functional material further comprises a nanotube system.

30. A method of thermally processing a functional material on a temperature-sensitive substrate in accordance with claim 29 wherein said nanotube system further comprises at least one material selected from the group consisting of carbon and FeMo.

31. A method of thermally processing a functional material on a temperature-sensitive substrate in accordance with claim 29 wherein said nanotube system further comprises predominantly single-walled nanotubes.

32. A method of thermally processing a functional material on a temperature-sensitive substrate in accordance with claim 29 wherein said nanotube system further comprises predominantly double-walled nanotubes.

33. A method of thermally processing a functional material on a temperature-sensitive substrate in accordance with claim 21 wherein said functional material further comprises at least one material selected from the group consisting of a transistor material, and a battery material.

34. A method of thermally processing a functional material on a temperature-sensitive substrate in accordance with claim 33 wherein said transistor material further comprises at least one material selected from the group consisting of silicon, germanium, a germanium-silicon alloy, and indium-doped titanium oxide.

35. A method of thermally processing a functional material on a temperature-sensitive substrate in accordance with claim 33 wherein said battery material further comprises Li.

36. A method of thermally processing a functional material on a temperature-sensitive substrate in accordance with claim 21 wherein said temperature-sensitive substrate further comprises at least one material selected from the group consisting of a biomaterial, a polymer, a resin, a metal, a ceramic, and a semiconductor.

* * * * *